United States Patent [19]

Minomo

[11] Patent Number: 4,799,029
[45] Date of Patent: Jan. 17, 1989

[54] SAW OSCILLATOR WITH ATTENUATOR FOR PROTECTING SAW ELEMENT

[75] Inventor: Shinzoo Minomo, Fukaya, Japan

[73] Assignee: Kabushiki Kaisha Toshiba, Kanagawa, Japan

[21] Appl. No.: 124,335

[22] Filed: Nov. 19, 1987

Related U.S. Application Data

[63] Continuation of Ser. No. 848,962, Apr. 7, 1986, abandoned.

[30] Foreign Application Priority Data

Jun. 29, 1985 [JP] Japan ................. 60-143757

[51] Int. Cl.⁴ .............................................. H03B 5/30
[52] U.S. Cl. .............................. 331/107 A; 331/108 B
[58] Field of Search ............... 331/107 A, 109, 182, 331/183, 108 B; 333/150, 193

[56] References Cited

U.S. PATENT DOCUMENTS 4,581,592 4/1986 Bennett ........................... 331/107 A

OTHER PUBLICATIONS

Dragonetti et al, Proceedings of the 1980 IEEE International Symposium on Circuits and Systems, Houston, Tex., 28-30 Apr. 1980, pp. 718-722.

Das et al, 1976 Ultrasonics Symposium Proceedings, IEEE, Annapolis, Md., 29 Sep.-1 Oct. 1976, pp. 306-308.

Dodson et al, 1980 Ultrasonics Symposium Proceedings, IEEE, Boston, Mass., 5-7 Nov. 1980, pp. 268-271.

Leja, 1979 Ultrasonics Symposium, IEEE, New Orleans, La., 26-28 Sep. 1979, pp. 865-869.

Eschler et al, Proceedings of the 32nd Annual Symposium on Frequency Control 1978, Atlantic City, NJ, 31 May-2 Jun. 1978, pp. 58-65.

*Primary Examiner*—Siegfried H. Grimm
*Attorney, Agent, or Firm*—Finnegan, Henderson, Farabow, Garrett, & Dunner

[57] ABSTRACT

An oscillator with a surface acoustic wave filter connected in its feedback path. The oscillator includes an attenuator in the feedback path for attenuating to a predetermined level an oscillating signal fed back to the surface acoustic wave filter from an amplifier used to excite the oscillation. The attenuation is sufficient to prevent damage to the acoustic wave filter.

2 Claims, 5 Drawing Sheets

P; $f_{RF}$ = 710 MHz

FIG. 11.

SAW OSCILLATOR WITH ATTENUATOR FOR PROTECTING SAW ELEMENT

This application is a continuation, of application Ser. No. 06/848,962, filed Apr. 7, 1986 and now abandoned.

BACKGROUND OF THE INVENTION

1. Field of the Invention

The present invention relates to an oscillator, and more particularly to an oscillator with a surface acoustic wave filter in its feedback path.

2. Description of Prior Art

Recently there have been developed CATV systems which use a tuner adapted for receiving a plurality of broadcast channels. These tuners use a so-called up/down heterodyne tuner which is better able to eliminate IF interruption. The up/down heterodyne tuner first converts the carrier frequency of the received signal to an intermediate frequency (IF) higher than the carrier frequency, and then converts the IF to a predetermined frequency lower than the carrier frequency.

Figure 1:
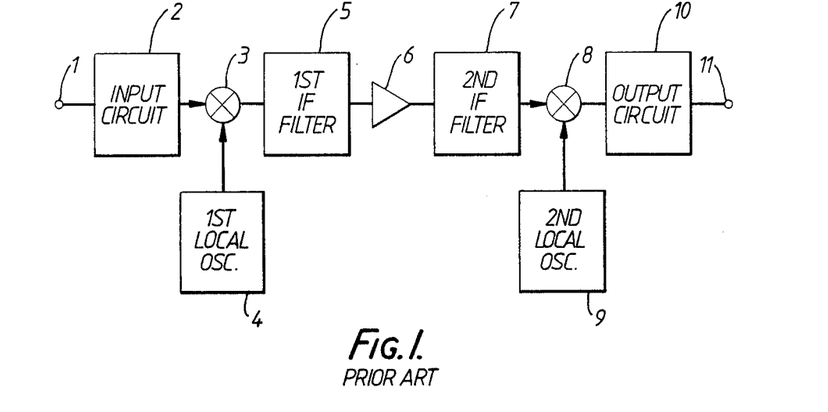
FIG. 1 is a block diagram showing an example of an up/down heterodyne tuner for CATV systems.

Up/down heterodyne tuners adapted for CATV systems are generally constructed as shown, for example, in FIG. 1. In FIG. 1, broadcast signals (input signals) with predetermined carrier frequencies among a frequency band ranging, e.g., from 50–550 MHz are provided to an input terminal 1 from a receiving antenna (not shown). The input signals are introduced to a first mixer 3 through an input circuit 2. In first mixer 3, the input signals are converted from their carrier frequencies to a predetermined intermediate frequency (IF) by using a first local oscillation signal applied from a first local oscillator 4 to first mixer 3. The IF signal may be, for example 612.75 MHz, which is higher than the highest frequency, 550 MHz, of the frequency band. The IF signal is then input to a first IF filter 5, an IF amplifier 6 and a second IF filter 7, where its level and tuned characteristic are adjusted to the desired level and characteristic by the circuit. The IF signal output from second IF filter 7 is input to a second mixer 8. In second mixer 8, the IF signal is converted from 612.75 MHz to a frequency, for example, 61.25 MHz, which is lower than the IF and which corresponds to one of the predetermined channels set for television receivers. The frequency conversion in the second mixer 8 is performed by a differential operation between the IF signal and a signal applied from a second local oscillator 9 to second mixer 8.

The signal output from the second mixer 8 is introduced to an output terminal 11 of the up/down heterodyne tuner through an output circuit 10. The output signal on output terminal 11 is supplied to a television receiver (not shown) as its so-called antenna input signal.

In the above described up/down heterodyne tuner, the selection of a desired channel is made by varying the frequency of first local oscillator 4. The output signal of this up/down heterodyne tuner is assigned to a frequency corresponding to any one of channels 1, 2, 3 and 5 in Japan, or channels 2, 3, 4 and 5 in the U.S.A. and Korea. The selection of the frequency accords to the frequency of the output signal of second local oscillator 9. Therefore, the output of second local oscillator 9 is varied in frequency in a band of 704–790 MHz in Japan, or 668–696 MHz in the U.S.A. and Korea, in general.

This up/down heterodyne tuner for CATV systems uses a Colpitts oscillator as second local oscillator 9. Colpitts oscillators contain L/C resonance circuits comprised of an inductor L and a capacitor C in a feedback path for feeding back an oscillation output of the oscillator to its input side with a prescribed phase relation. However, a Colpitts oscillator of this type has a disadvantage in that its output frequency easily fluctuates as a result of changes in temperature and humidity or the bias voltage supplied to the circuit. Therefore, the output frequency of the up/down heterodyne tuner for CATV systems becomes unstable when an L/C resonance circuit is used for its second local oscillator 9, and interferes with broadcast reception by the television receiver.

Figure 2:
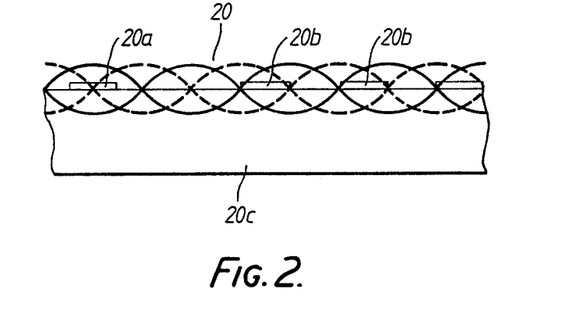
FIG. 2 is a diagrammatical drawing for explaining transmissions of surface acoustic waves on a SAW filter.

Many attempts have been made to improve the stability of the output frequency of the up/down heterodyne tuner. In these attempts, an oscillator using a surface acoustic wave filter (referred to as a SAW filter hereinafter) in its feedback path has been developed, so that an up/down heterodyne tuner with an oscillator of the described type as its second local oscillator 9 is able to produce an oscillation output with a relatively stable frequency. The SAW filters are constructed principally as shown in FIG. 2. That is, interdigital transducer electrodes (IDT electrodes) 20a and grating reflectors (GRs) 20b respectively, made of, e.g., aluminum film, are laid on a base 20c, e.g., made of the lithium-tantalate $LiTaO_3$ for mounting IDT electrodes 20a and GRs 20b and transmitting acoustic waves therebetween.

Oscillators using the SAW filter create a problem in that the SAW filter is itself apt to be easily damaged by the oscillation signal in a feedback path. This problem is caused by the energy of a surface acoustic wave in the SAW filter concentrating and accumulating on specified portions of the SAW filter. The surface acoustic wave arises on base 20c as a standing wave, as illustrated by solid lines shown in FIG. 2. In FIG. 2, the solid lines also show the distribution of displacement of base 20c due to the standing wave, while the dotted lines show the distribution of mechanical strain due to the standing wave in base 20c. That is, the energy of the surface acoustic wave, which is sometimes as high as the exciting power for the oscillator, is accumulated in the SAW filter due to the standing wave. The energy is concentrated on the surface of base 20c of the SAW filter. An excessive concentration of energy causes a so-called migration phenomenon in IDT electrode 20a or GRs 20b fixed on the surface of base 20c of the SAW filter. The migration phenomenon is the phenomenon that voids or hillocks occur in metal films like electrodes formed on dielectric bases, as known, e.g., in the field of semiconductor device techniques. It is believed that the voids or hillocks occur as a result of so-called metal fatigue phenomenon having excessively advanced due to repetition of mechanical strains in metals.

In the SAW filters, the voids or hillocks increase the electric resistance of IDT electrode 20a or GRs 20b. Further, part of the oscillation signal energy is consumed in base 20c as Joule equivalent according to the piezoelectric effect in base 20c. The increased electric resistances and the consumed Joule equivalent energy further promote the damage of the SAW filters.

Therefore, oscillators using SAW filters have been conventionally used only when the oscillators are not excited to a high energy oscillation state. In other words, the oscillators must be operated at a low energy state. The exciting energy is very critical and it is difficult to maintain the oscillation at low energy levels.

SUMMARY OF THE INVENTION

An object of the present invention is to provide an oscillator in which a SAW filter provided in a feedback path of the oscillator is protected from damage due to the oscillation signal fed back to the SAW filter.

This and other objects are achieved in the oscillator of the present invention by attenuating the oscillation signal supplied to the SAW filter. This oscillator includes:
1. an amplifier,
2. a feedback path for feeding back an output of the amplifier to its input end,
3. a surface acoustic wave filter (SAW filter) connected in the feedback path, and
4. an attenuator for attenuating the level of the output applied to the SAW filter.

Additional objects, advantages, and features of the present invention will further become apparent to persons skilled in the art from a study of the following description and of the accompanying drawings in which:

DESCRIPTION OF THE PREFERRED EMBODIMENT

The present invention will now be described in detail with reference to the accompanying drawings, namely, FIGS. 1 to 11. Throughout the drawings, like reference numerals and letters are used to designate like or equivalent elements for the sake of simplicity of explanation.

Figure 3:
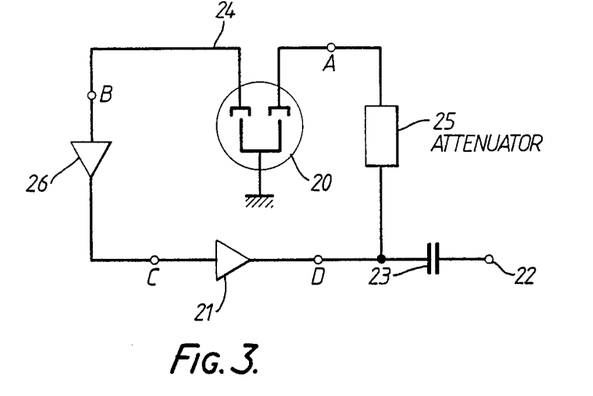
FIG. 3 is a block diagram showing the preferred embodiment of the oscillator according to the present invention.

Referring now to FIG. 3, there is shown a block diagram of an embodiment of an oscillator according to the present invention. In FIG. 3, an amplifier 21 for exciting the oscillation is provided with its oscillation output introduced to an output terminal 22 through a capacitor 23. The oscillation output of amplifier 21 is fed to a feedback path 24 with a SAW filter 20 and fed back to the input end of amplifier 21 through feedback path 24. In feedback path 24, an attenuator 25 is provided between the output of amplifier 21 and SAW filter 20. Further a buffer amplifier 26 is connected between SAW filter 20 and the input of amplifier 21.

Attenuator 25 attenuates the oscillation output of amplifier 21 to a predetermined level so as not to damage SAW filter 20. On the other hand, buffer amplifier 26 amplifies the output of SAW filter 20 to compensate for the gain loss of the feedback signal in SAW filter 20.

Figure 4:
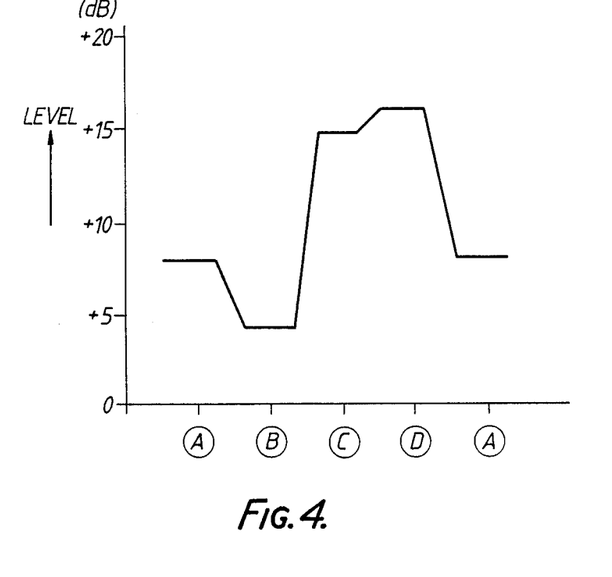
FIG. 4 is a level diagram showing signal levels at circuit positions indicated in the circuit of FIG. 3.

FIG. 4 shows levels of the signal in feedback path 24 at predetermined circuit positions in FIG. 3. That is A, B, C and D in FIG. 4 indicate the predetermined circuit positions in FIG. 3, i.e., the input end of SAW filter 20, the input end of buffer amplifier 26, the input end of oscillation exciting amplifier 21 and the output end of oscillation exciting amplifier 21. As seen from the level diagram of FIG. 4, the feedback signal supplied to feedback path 24 is attenuated to about 7 dB at position A as described in detail later. The feedback signal further lowers to about 4 dB at position B due to the gain loss in SAW filter 20. Buffer amplifier 26 raises the level of the feedback signal at position B to about 15 dB so that it compensates for the gain loss in SAW filter 20. The feedback signal with the level of about 15 dB at position C is applied to oscillation exciting amplifier 21. Oscillation exciting amplifier 21 raises the level of the feedback signal from buffer amplifier 26 to about 17 dB. That is, oscillation exciting amplifier 21 raises the level by only about 2 dB, but oscillation exciting amplifier 21 operates in its saturation region so that it sufficiently amplifies the oscillation signal. Therefore, the oscillator shown in FIG. 3 is able to supply an oscillation output with large power to foreign circuits, e.g., second mixer 8 of the up/down heterodyne tuner as shown in FIG. 1.

Oscillation exciting amplifier 21 functions to provide sufficient energy, or power, to maintain the oscillation of the oscillator itself and also supplies the power which is needed in foreign circuits like second mixer 8 in FIG. 1. The oscillation power is so large that it would damage SAW filter 20 if supplied directly. However, attenuator 25, connected in feed-back path 24 prior to SAW filter 20, attenuates the power of the oscillation signal provided to feedback path 24 to a desired level not damaging to SAW filter 20. That is, attenuator 25 attenuates the oscillation signal of about 17 dB at position D to about 7 dB. The level of attenuation is determined not only by the gain loss in SAW filter 20, but also must be at a level necessary to maintain the oscillation of the oscillator. In other words, the amount of attenuation provided by attenuator 25 is determined from the following two conditions which conflict with each other. One condition is for maintaining the oscillation of the oscillator, and the other is for preventing SAW filter 20 from being damaged due to the excessive energy of the feedback oscillation signal.

Referring now to FIGS. 5 through 9, some conditions for maintaining the oscillation of the oscillator will be discussed in detail hereinafter. The relation of attenuator 25 to the oscillation loop of the oscillator will be also described.

Figure 5:
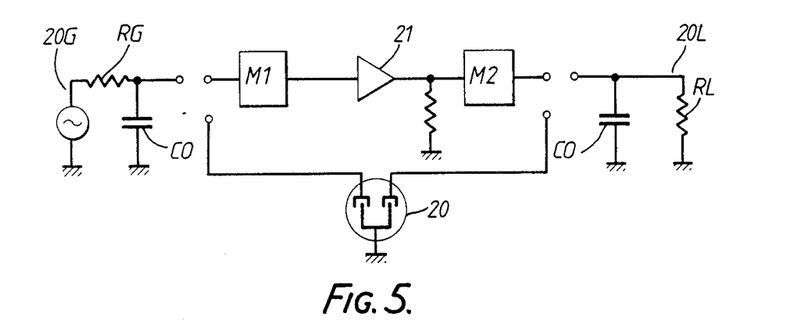
FIGS. 5, 6, 7, and 8 are equivalent circuit diagrams for determining constants of some electrical components in the oscillator according to the present invention.

First, the description will assume that buffer amplifier 26 is eliminated from the oscillator shown in FIG. 3, for convenience's sake of explanation, there being nothing novel or unknown regarding the buffer amplifier. FIG. 5 shows an equivalent circuit for the oscillator shown in FIG. 3. In FIG. 5, SAW filter 20 is represented by two sections 20L and 20G. One section 20L is equivalent to the load impedance of oscillation exciting amplifier 21 and it is comprised of capacitance Co and resistance RL. The other section 20G is equivalent to the signal source impedance for oscillation exciting amplifier 21 and is comprised of capacitance Co and resistance RG. Further, it is assumed that matching circuits M1 and M2 are provided at both the input and output ends of oscillation exciting amplifier 21, respectively. Matching circuits M1 and M2 respectively match with load impedance RL//Co and signal source impedance RG//Co and provide predetermined phase shifts between the signals at both the input and output ends of SAW filter 20, respectively. Provided the amplifying gain of amplifier 21 is higher than the gain loss of the SAW filter by about 6-8 dB, the oscillation in the oscillator will be maintained in a stable state. Further, if the condition RL+RG>Rm (where RM is the equivalent resistance of Saw Filter 20) is satisfied, the influence of mismatching the oscillation exciting amplifier 21 and both load and signal source impedances RL//Co, RG//Co represented by equivalent resistance Rm of SAW filter 20 is reduced.

If the oscillator is used as second local oscillator 9 in the up/down heterodyne tuner shown in FIG. 1, oscillation exciting amplifier 21 must be matched with the input impedance ZM of second mixer 8 to which oscillation exciting amplifier 21 is connected. Assuming that input impedance ZM of second mixer 8 is $110-j\cdot 300\Omega$ when observed through a connecting capacitance CM of, e.g., 1.5 pF, the oscillation output level required in practice at the input end of second mixer 8 becomes about +12 dB (15.85 mW). By assuming that the peak voltage of the oscillation output is 70% of the source-drain voltage, Vds, i.e., 7.59 V, a voltage generated across the source and the drain electrodes of an amplifying means, e.g., an FET constituting oscillation exciting amplifier 21, equivalent load resistance RL is obtained as follows $$RL = \frac{(7.59 \times 0.7)^2}{2 \times 0.01585} \approx 890\Omega$$

The current value of the oscillation output IL is given as IL=5.97 mA at that time.

Therefore, the bias condition of oscillation exciting amplifier 21 must be determined in calculating input impedance ZM of second mixer 8 as a load impedance for the oscillator.

The connection of oscillation exciting amplifier 21 to second mixer 8 will next be discussed with reference to the oscillation's stability. When an FET 3Sk115 is used as the amplifying device of oscillation exciting amplifier 21, the y- parameters of the FET 3SK115 at a frequency around 674 MHz are as follows, $Yi=0.557+j\, 3.65$ ms $yf=19.4-j\cdot 4.46$ ms $yr=0\,001-j\cdot 0.07$ ms $yo=0.382+j\cdot 1.44$ ms Therefore, the admittance YL transformed from the input impedance ZM of second mixer 8 is calculated as $YL=1.12+j\cdot 3.41$ ms.
Where, adding output admittance yo of FET 3SK115 to input admittance YL, the total admittance Yo becomes as follows, $Yo=yo+YL=1.50+j\cdot 4.85$ ms Then, a stability coefficient C of Linvill's Stability-judge Equation will be calculated as follows, $$\begin{aligned}C &= |yf\cdot yr| = [2\cdot yi\cdot yo - Reol\cdot(yf\cdot yr)]\\ &= 1.99\times 0.07/[2\times 0.552\times 1.50 - 19.9\times 0.07\times\\ &\quad (-13.1-89.2)] = 0.826\end{aligned}$$

As seen from the above equation, a relation $0<C<1$ is established, so that the connection of oscillation exciting amplifier 21 to second mixer 8 will be stable.

Figure 6:
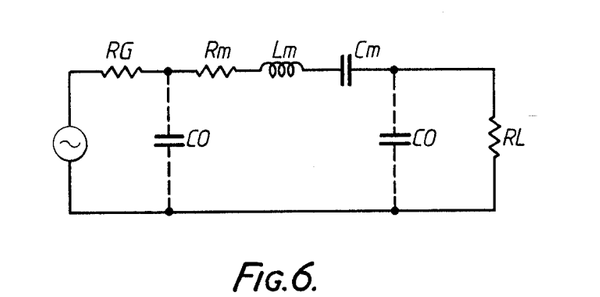

Equivalent signal source impedance RG and equivalent load impedance RL may be determined as follows. An electrical equivalent circuit for SAW filter 20 is shown in FIG. 6. In FIG. 6, RM, Lm and Cm are electrical coefficients equivalently representing the mechanical coefficients of SAW filter 20. Co is the input and output capacitance as mentioned before.

First, for determining the frequency range BW of the oscillation signal, it is assumed that the accuracy of the center frequency is ±0.01%, and a practical tuning range is ±25% of the frequency range BW where the oscillation signal lowers up to 3 dB in level. Then the following equation is obtained, 0.25 BW=±0.00001×674 MHz=±67.4 KHz From the above equation, the frequency range, BW=270 KHz is obtained.

Including the Q of SAW filter 20 in considering equivalent load impedance RL in FIG. 6 as QL and assuming QL as follows, QL=QU·Rm/(Rm+RL+RG) and substituting following respective data into the above equation of QL,
QL=2500 (∵ QL=fo/BW=674 MHz/270 KHz=2500)
RM=150 Ω
QU=11,285 signal source and load impedance RG, RL are obtained as, RG=RL=260 Ω

Figure 7:
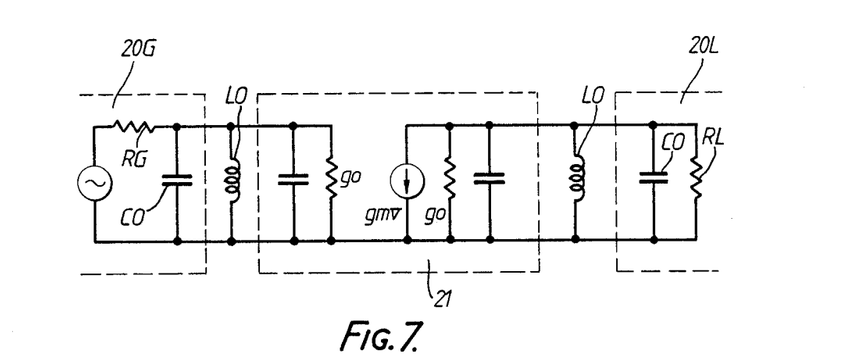

In addition, phase lags of the oscillation signal at both the amplifying device and SAW filter 20 must be compensated for. The compensation will be discussed with reference to FIG. 7, another equivalent circuit of the oscillator. In FIG. 7, however, inductances Lo are connected to both ends of oscillation exciting amplifier 21 in parallel with signal source impedance RG//Co and load impedance RL//Co for compensating the phase lags. As described before, the susceptance of the FET 3SK115 is −4.46 ms, while the input and output susceptances of SAW filter 20, considering input and output capacitances Co each of 1.6 pF, are both −6.8 ms. The total susceptance of the circuit, then becomes −4.46+(−6.8×2) (=−18.06) ms. The phase lags caused by the susceptance are compensated by inductances Lo in FIG. 7. Thus, an inductive susceptance of +18.06 ms in total is required for eliminating the capacitive susceptance, −18.06 ms. The reactance to be given by each inductance Lo is calculated as follows, Lo=1/[(18.06×10⁻³)/2]=110.75 Ω

Each inductance Lo is, therefore, calculate as Lo=26 nH (Lo =110.75/2×674 MHz=26 nH), for compensating the phase lags.

In the above example, the compensation of the phase lags of the oscillation signal at oscillation exciting amplifier 21 and SAW filter 20 is made by inductances Lo.

Figure 8:
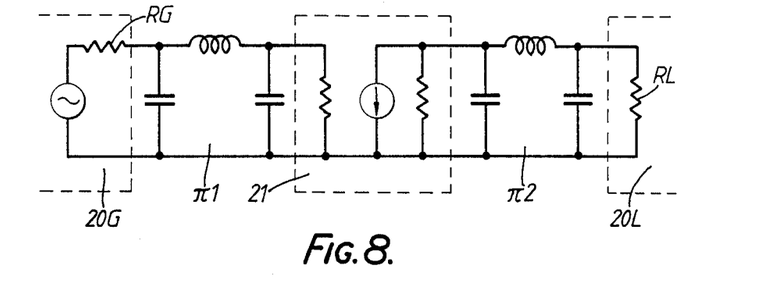

But it is achieved by other ways, e.g., π-shape matching circuits π1 and π2 as shown in FIG. 8. The compensation by π-shape matching circuits as shown in FIG. 8 has the advantage that respective elements in the π-shape matching circuits are able to be fixed, independently from the input and output impedances.

As described above, both conditions, the load matching condition of the oscillator to its load circuit, e.g., second mixer 8 in FIG. 1, and the phase lag compensation condition for oscillation exciting amplifier 21 and SAW filter 20, have been obtained in the equivalent circuits shown in FIGS. 5 to 8.

Figure 9:
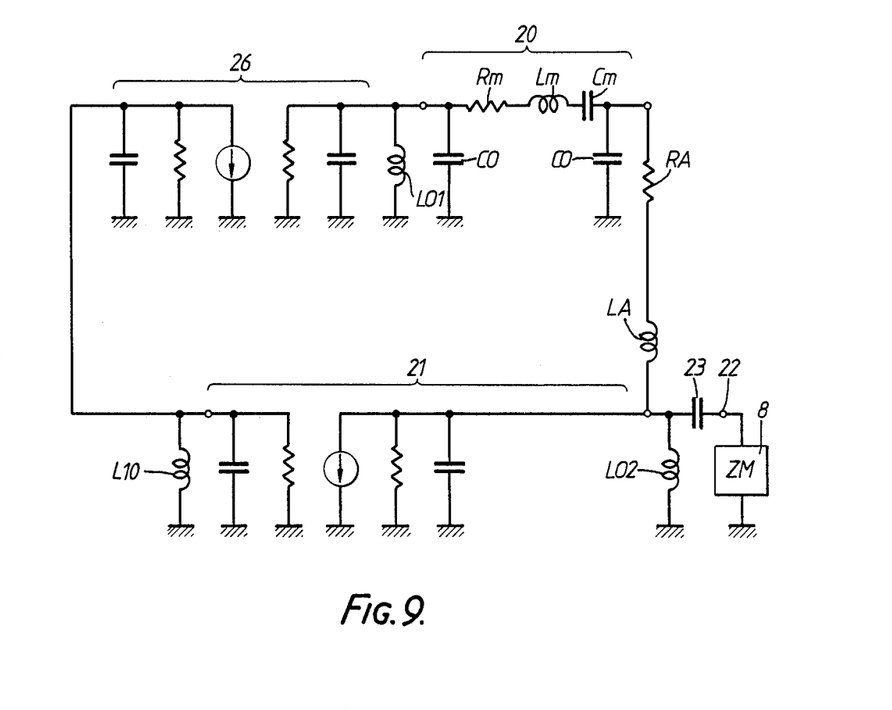
FIG. 9 is an equivalent circuit diagram of the oscillator shown in FIG. 3.

The allowable energy of the oscillation signal fed back to SAW filter 20 will be discussed with reference to FIG. 9, an equivalent circuit of the oscillator. In FIG. 9, blocks 20 and 21, respectively, show electrical equivalent circuits of the SAW filter and the oscillation exciting amplifier similar to FIG. 7. Capacitances Co connected at both ends of SAW filter 20 represent its input and output capacitance. Block 26 connected between the output end of SAW filter 20 and oscillation exciting amplifier 21 represents an electrical equivalent circuit of the buffer amplifier. Resistor RA and inductor LA connected in series between the output end of oscillation exciting amplifier 21 and SAW filter 20 represent attenuator 25 and matching circuit M2 as shown in FIG. 3, respectively. Inductance L01 and L02 provided at the output ends of both SAW filter 20 and oscillation exciting amplifier 21 compensate the respective phase lags of the oscillation signal in SAW filter 20 and the oscillation exciting amplifier 21. The values of inductances L01 and L02 are set to the value of inductance Lo, calculated with reference to both the susceptance of the amplifying device, e.g., the FET constituting oscillation exciting amplifier 21, and the susceptance based on input and output capacitances Co of SAW filter 20 as mentioned before. Inductance L10, connected to the input end of oscillation exciting amplifier 21, is provided for matching the phase discrepency between buffer amplifier 26 and oscillation exciting amplifier 21. Attenuator 25 includes resistor RA for attenuating the oscillation signal fed back to SAW filter 20 through feedback path 24. Inductor LA connected in series with resistor RA functions as an 180° phase shifter for feeding back the output of SAW filter 20 to its input end after shifting the phase of the output, i.e., the phase of the oscillation output of oscillation exciting amplifier 21, 180° when SAW filter 20 is an inversed phase type filter.

Figure 10:
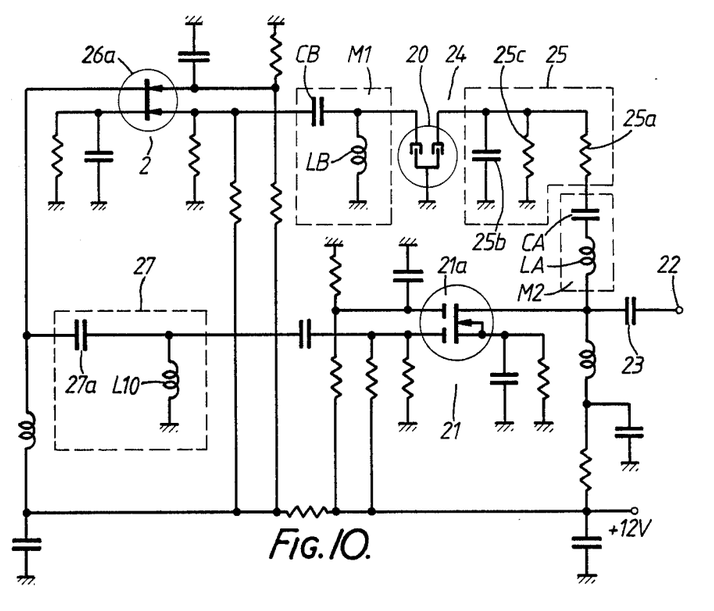
FIG. 10 is a circuit diagram showing a practical circuit construction of the oscillator according to the present invention.

Referring now to FIG. 10, there will be described in detail a practical construction of the oscillator shown in FIG. 3. In FIG. 10, oscillation exciting amplifier 21 is comprised of MOSFET 21a as its amplifying device. The drain electrode of MOSFET 21a is connected to an output terminal 22 of the oscillator through a capacitor 23. Output terminal 22 is provided for the connection with, for example, second mixer 8 of the CATV up/down heterodyne tuner as shown in FIG. 1. The drain electrode of MOSFET 21a is further connected to attenuator 25 through matching circuit M2 consisting of a series circuit of inductor LA and a capacitor CA. Attenuator 25 includes a series resistor 25a, a bypass capacitor 25b and a bypass resistor 25c. Series resistor 25a operates to attenuate the oscillation signal fed back to SAW filter 20 together with bypass capacitor 25b. Bypass resistor 25c makes a discharge path for bypass capacitor 25b. Due to both series resistor 25a and bypass capacitor 25b, the oscillation signal applied to SAW filter 20 is suppressed to the level shown in FIG. 4, position B.

Buffer amplifier 26 includes a gallium-arsenide transistor (GaAs transistor) 26a as its amplifying device. The output end of SAW filter 20 is connected to the one gate of GaAs transistor 26a through matching circuit M1 comprised of a series capacitor CB and a bypass inductor LB. The drain electrode of GaAs transistor 26a is connected to the one gate of MOSFET 21a through a phase adjusting circuit 27 comprised of a bypass inductor operating as inductance L10 shown in FIG. 9 and a series capacitor 27a. MOSFET 21a in oscillation exciting amplifier 21 and GaAs transistor 26a in buffer amplifier 26 are connected at their respective source electrodes and the other gate electrodes to bias circuits.

In the oscillator shown in FIG. 10, oscillation exciting amplifier 21 produces an oscillation signal of sufficient power by saturation zone amplification of MOSFET 21a and then provides the oscillation signal to, e.g., second mixer 8 in the CATV up/down heterodyne tuner shown in FIG. 1. The oscillation signal provided to feedback path 24 is, however, attenuated sufficiently by attenuator 25 so that SAW filter 20 is protected from damage by the energy of the oscillation signal from oscillation exciting amplifier 21.

GaAs transistor 26a in buffer amplifier 26 acts to reduce the load of SAW filter 20 from the oscillation signal. GaAs transistor 26a has an extremely small input capacitance in comparison to any other known amplifying devices. Therefore, inductance, LB in matching circuit M1, connected to the output end of SAW filter 20, may be set larger in inverse proportion corresponding to the small input capacitance of GaAs transistor 26a. The large inductance LB serves to reduce the power of the oscillation signal applied to SAW filter 20. In addition, the large inductance LB allows SAW filter 20 to operate for the oscillation signal with a higher frequency.

Figure 11:
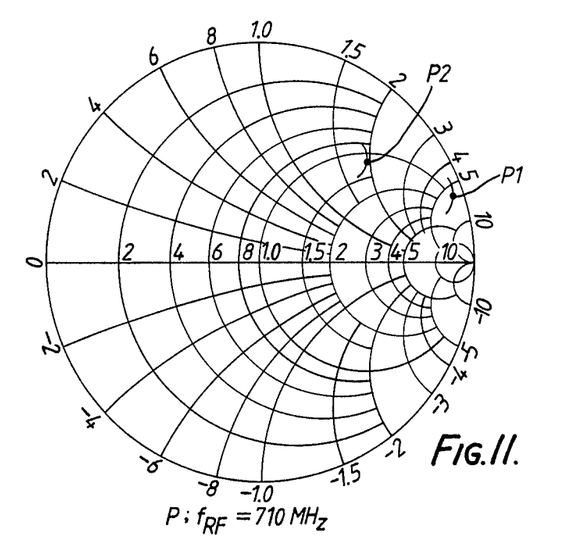
FIG. 11 is a Smith-chart for explaining the operation of the circuit shown in FIG. 10, in comparison with a conventional oscillator.

Referring now to FIG. 11, the Smith-chart in 50 Ω normalization, the calculation of output impedance Z of SAW filter 20 will be described. The output impedance characteristic of a GaAs transistor, e.g., 3SK121-Y, is indicated by P1 in the chart. From the coordinate system of the Smith-chart corresponding to P1, the input resistance R1 of 55 Ω and the input reactance X1 of 350 Ω at the signal frequency of 710 MHz are read. The output impedance Z1 of GaAs transistor 3SK121-Y is obtained as Z1= 354.3 Ω. The output voltage V1 and the current I1 at the time are also obtained as V1=471.3 mV and I1=1.33 mA. The current I1 of 1.33 mA is smaller than the rated current of GaAs transistor 3SK121-Y, 2.0 mA, so that SAW filter 20 is protected from being damaged, by the oscillation signal.

For a comparison to the above, a MOSFET, 3SK115FA-1, g used in buffer amplifier 26 will be described. The output impedance characteristic of MOSFET 3SK115FA-1 is indicated by P2 in the chart. From the coordinate system of the Smith-chart corresponding to P2, the input resistance R2 of 60 Ω . and the input reactance X2 of 95 Ω at the same signal frequency of 710 MHz are read. The output impedance Z2 of MOSFET 3SK115FA-1 is obtained as Z2=112.4 Ω. The output voltage V2 and the current I2 at that time are also obtained as V2=265.0 mV and I2=2.36 mA. The current I2 of 2.36 mA is larger than the rated current, 2.0 mA. Therefore, SAW filter 20 will be damaged if an amplifying device with a relatively large input capacitance, e.g., a MOSFET, is used as the amplifying device in buffer amplifier 26.

As described above, the oscillator according to the present invention is able to suppress an oscillation signal fed back to an SAW filter in a feedback path of the oscillator to a sufficiently low level to prevent damage to the SAW filter. The present invention also is able to provide an oscillator which operates stably at an oscillation signal with a higher frequency which accompanies a relatively high energy signal.

In the above embodiment, attenuator 25 may be located at any location in feedback path 24, and is not limited to the position prior to SAW filter 20. Oscillation exciting amplifier 21 and buffer amplifier 26 may be made of two or more amplifying devices, respectively. Further, the present invention may be used widely for a general oscillator with an SAW filter in its feedback path, not being limited to the oscillator for a CATV up/down heterodyne tuner.

What is claimed is:

1. An oscillator comprising:
    an amplifier means with an input and an output, said amplifier means exciting an oscillation and producing an output signal at its output;
    a feedback path for feeding back said output signal of said oscillation exciting amplifier means to its input, said feedback path including:
        an inductor and an attenuator connected in series to the output of said amplifier for attenuating the level of said output signal and for shifting the phase of said output signal by 180°;
        a surface acoustic wave filter connected to receive the phase shifted output signal from said attenuator and inductor;
        a second inductor connected between the output of said surface acoustic wave filter and ground for phase compensation of the original output from said surface acoustic wave filter;
        a buffer amplifier means connected between the output of said surface acoustic wave filter and the input of said oscillation exciting amplifier means; and
        a third inductor connected on one end to the output of said buffer amplifier means and on the other end to ground, wherein said buffer amplifier and said third inductor act to again shift the phase of said phase shifted output signal by 180°.

2. An oscillator according to claim 1, wherein said buffer amplifier means is comprised of a gallium arsenide amplifying device.

* * * * *